(12) United States Patent
Kawanami (10) Patent No.: US 9,025,341 B2
(45) Date of Patent: May 5, 2015

(54) POWER CONVERTER (71) Applicant: Kabushiki Kaisha Yaskawa Denki, Kitakyushu-shi (JP)

(72) Inventor: Yasuhiko Kawanami, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 98 days.

(21) Appl. No.: 13/905,129

(22) Filed: May 30, 2013

(65) Prior Publication Data
US 2013/0258628 A1    Oct. 3, 2013

Related U.S. Application Data (63) Continuation of application No. PCT/JP2011/070125, filed on Sep. 5, 2011.

(30) Foreign Application Priority Data

Dec. 1, 2010 (JP) ................................. 2010-268743

(51) Int. Cl.
*H05K 7/00* (2006.01)
*H02M 1/00* (2006.01)
(Continued)

(52) U.S. Cl.
CPC .............. *H02M 1/00* (2013.01); *H01L 25/072* (2013.01); *H01L 25/18* (2013.01); *H02M 7/003* (2013.01); *H01L 2224/48227* (2013.01); *H01L 2224/73265* (2013.01); *H01L 2224/48091* (2013.01); *H01L 2924/13091* (2013.01); *H01L 2924/13055* (2013.01); *H01L 2924/30107* (2013.01); *H01L 23/49844* (2013.01); *H01L 23/50* (2013.01)

(58) Field of Classification Search
CPC ................. H01L 2924/00; H01L 2224/48091; H01L 2924/13055; H01L 2924/30107; H01L 2924/00014; H01L 2224/48227
USPC ......... 361/783, 792, 760, 764, 749, 728, 736, 361/794; 257/678–700
See application file for complete search history.

(56) References Cited

U.S. PATENT DOCUMENTS 5,544,035 A * 8/1996 Beriger et al. ................. 363/132
7,161,235 B2 * 1/2007 Maeno .......................... 257/691
(Continued)

FOREIGN PATENT DOCUMENTS

CN      101431859       5/2009
JP      2001-332688     11/2001
(Continued)

OTHER PUBLICATIONS

International Search Report for corresponding International Application No. PCT/JP2011/070125, Nov. 8, 2011.
(Continued)

*Primary Examiner* — Yuriy Semenenko
(74) *Attorney, Agent, or Firm* — Mori & Ward, LLP (57) ABSTRACT

A power module includes a power module body portion and a wiring board. The power module body portion includes P-side semiconductor elements and N-side semiconductor elements, and a P-side terminal connection portion, a U-phase terminal connection portion, and an N-side terminal connection portion which establish electrical connection with the wiring board on an upper surface of the power module body portion and into which a current flows from the wiring board and from which a current flows to the wiring board.

12 Claims, 8 Drawing Sheets

(51) Int. Cl.
  *H01L 25/07*    (2006.01)
  *H01L 25/18*    (2006.01)
  *H02M 7/00*     (2006.01)
  *H01L 23/498*       (2006.01)
  *H01L 23/50*        (2006.01)

(56) References Cited

U.S. PATENT DOCUMENTS 8,526,189 B2 * 9/2013 Yamanaka et al. ............ 361/733
2001/0045639 A1 * 11/2001 Hanamura ..................... 257/691

FOREIGN PATENT DOCUMENTS

| JP | 2002-033446 | 1/2002 |
| JP | 2004-214452 | 7/2004 |
| JP | 2007-273884 | 10/2007 |
| JP | 2008-103623 | 5/2008 |

OTHER PUBLICATIONS

Written Opinion for corresponding International Application No. PCT/JP2011/070125, Nov. 8, 2011.

Chinese Office Action for corresponding CN Application No. 201180057738.6, Nov. 15, 2014.

* cited by examiner

POWER CONVERTER

CROSS-REFERENCE TO RELATED APPLICATIONS

The present application is a continuation application of PCT/JP2011/070125, filed Sep. 5, 2011, which claims priority to Japanese Patent Application No. 2010-268743, filed Dec. 1, 2010. The contents of these applications are incorporated herein by reference in their entirety.

BACKGROUND OF THE INVENTION

1. Field of the Invention

The present disclosure relates to a power converter.

2. Description of the Related Art

Hitherto, a power converter that includes a power-conversion semiconductor element is available (see, for example, Japanese Unexamined Patent Application Publication No. 2008-103623).

The foregoing publication discloses a semiconductor device (power converter) that includes an insulated-gate bipolar transistor (IGBT, a power-conversion semiconductor element), a lead frame electrically connected to the IGBT, and a mold resin provided to include therein the IGBT and the lead frame. In this semiconductor device, the lead frame protrudes from a side surface of the mold resin. Also, in this semiconductor device, it is considered that it is desired to mount a wiring board on the lead frame to establish electrical connection with an external device.

SUMMARY OF THE INVENTION

According to an aspect of the disclosure, there is provided a power converter including a power converter body portion and a wiring board that is electrically connected to the power converter body portion. The power converter body portion includes a power-conversion semiconductor element and a wiring board connection portion, the wiring board connection portion including a first wiring board connection portion and a second wiring board connection portion which establish electrical connection with the wiring board on an upper surface of the power converter body portion and into which a current flows from the wiring board and from which a current flows to the wiring board. Positions of the first wiring board connection portion and the second wiring board connection portion with respect to the power-conversion semiconductor element are set so that, in a case where a current flows from the wiring board into the power-conversion semiconductor element via one of the first wiring board connection portion and the second wiring board connection portion and then the current flows out toward the wiring board via the other of the first wiring board connection portion and the second wiring board connection portion, a direction in which a current that is to pass through the power-conversion semiconductor element flows is substantially opposite to a direction in which a current that has passed through the power-conversion semiconductor element flows, and flowing of the currents in substantially opposite directions enables cancelling out of changes in magnetic fluxes.

DESCRIPTION OF THE EMBODIMENTS

Hereinafter, embodiments of the present disclosure will be described with reference to the drawings.

First Embodiment

First, the configuration of a power module 100 according to a first embodiment of the present disclosure will be described with reference to FIGS. 1 to 9. The power module 100 is an example of the "power converter" that is disclosed.

Figure 1:
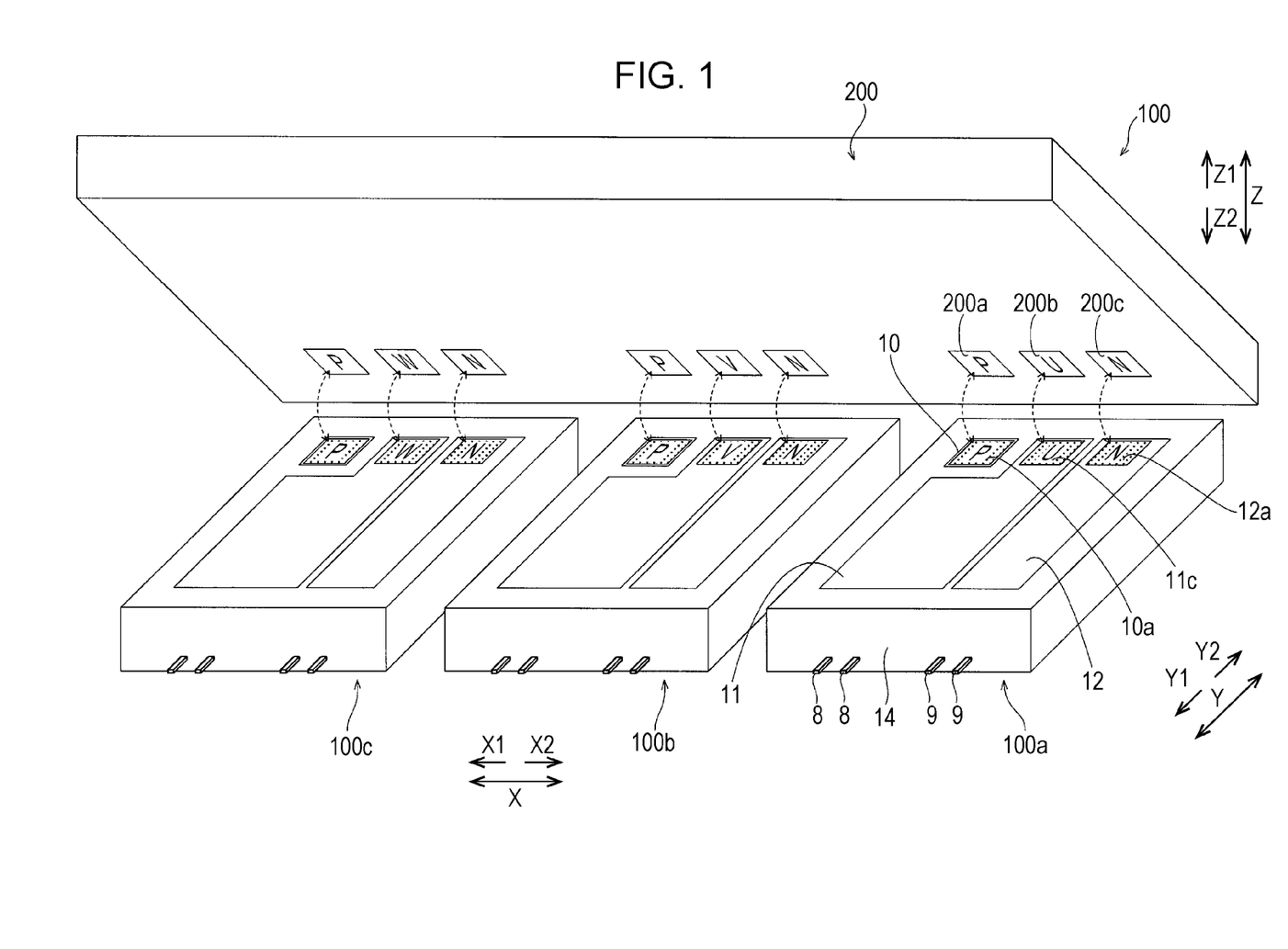
FIG. 1 is an exploded perspective view illustrating the configuration of a power module according to a first embodiment of the present disclosure.

As illustrated in FIG. 1, the power module 100 according to the first embodiment of the present disclosure includes three power module body portions 100a, 100b, and 100c, and a wiring board 200. Each of the power module body portions 100a, 100b, and 100c is an example of the "power converter body portion" that is disclosed.

The power module 100 constitutes a three-phase inverter circuit that is to be connected to a motor or the like. In the power module body portions 100a, 100b, and 100c included in the power module 100, the portions on the side indicated by arrow X1 function as upper arms (P side) of the three-phase inverter circuit. In the power module body portions 100a, 100b, and 100c, the portions on the side indicated by arrow X2 function as lower arms (N side) of the three-phase inverter circuit. The power module body portions 100a, 100b, and 100c perform power conversion for a U-phase, a V-phase, and a W-phase, respectively. The power module body portions 100a, 100b, and 100c have substantially the same configuration, and thus description will be given below mainly of the power module body portion 100a.

Figure 2:
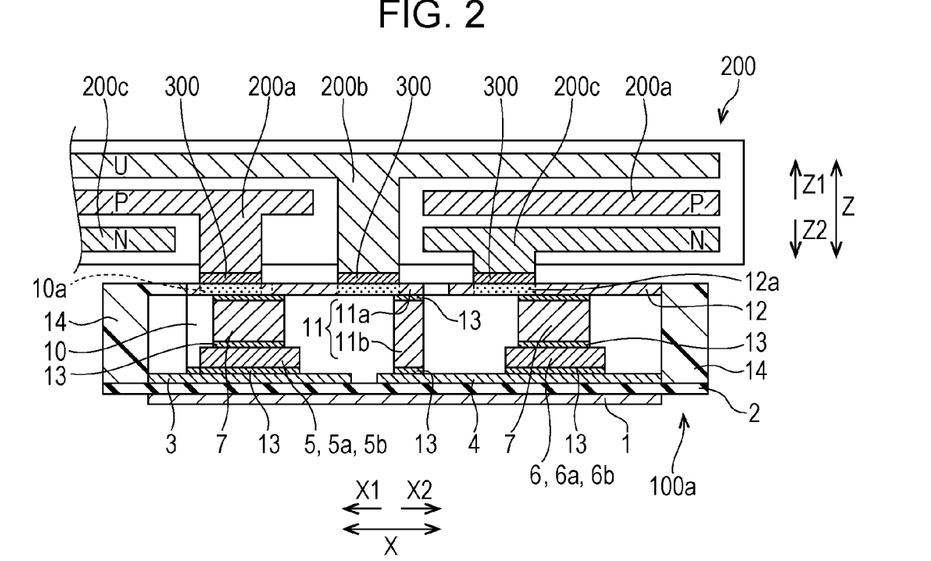
FIG. 2 is a cross-sectional view taken along an X direction illustrating the configuration of the power module according to the first embodiment of the present disclosure.

As illustrated in FIG. 2, a P-phase busbar 200a, a U-phase busbar 200b, and an N-phase busbar 200c, each formed of a conductive metal plate, are provided in the wiring board 200. As illustrated in FIG. 1, portions of the P-phase busbar 200a, the U-phase busbar 200b, and the N-phase busbar 200c are exposed on the lower surface (the surface on the side indicted by arrow Z2) of the wiring board 200 so as to correspond to a P-side terminal connection portion 10a, a U-phase terminal connection portion 11c, and an N-side terminal connection portion 12a (described below) of the power module body portion 100a. The U-phase busbar 200b and the N-phase busbar 200c are an example of the "input/output line" and an example of the "negative-side line" that are disclosed, respectively. The P-side terminal connection portion 10a, the U-phase terminal connection portion 11c, and the N-side terminal connection portion 12a are an example of the "positive-side terminal connection portion", an example of the "input/output terminal connection portion", and an example of the "negative-side terminal connection portion" that are disclosed, respectively. In the wiring board 200, a V-phase busbar and a W-phase busbar are provided so as to correspond to a V-phase terminal connection portion and a W-phase terminal connection portion (described below) of the power module body portions 100b and 100c.

The power module body portion 100a is configured to be electrically connected to the wiring board 200 on the upper surface (the surface on the side indicated by arrow Z1) of the power module body portion 100a. Specifically, as illustrated in FIGS. 1 to 3, the power module body portion 100a is configured so that the P-side terminal connection portion 10a, the U-phase terminal connection portion 11c, and the N-side terminal connection portion 12a (described below, see dotted portions) of the power module body portion 100a are connected to the portions of the P-phase busbar 200a, the U-phase busbar 200b, and the N-phase busbar 200c of the wiring board 200 that are exposed on the lower surface (the surface on the side indicated by arrow Z2) of the wiring board 200, via bump electrodes 300.

Figure 3:
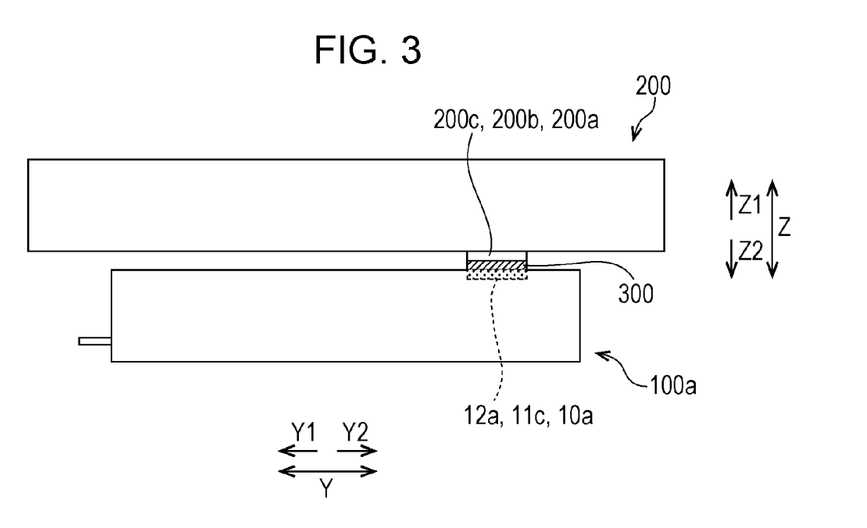
FIG. 3 is a side view of the power module according to the first embodiment of the present disclosure.
Figure 4:
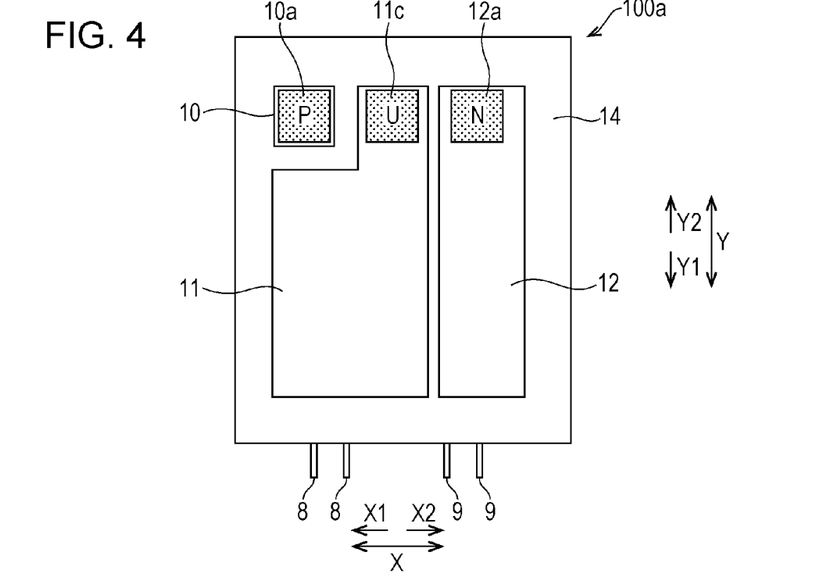
FIG. 4 is a plan view of a power module body portion according to the first embodiment of the present disclosure.

As illustrated in FIG. 3, the power module body portion 100a and the wiring board 200 are configured to be disposed with a certain distance (space) therebetween. This space is filled with, for example, a thermal conductive resin or the like. Accordingly, it becomes possible to fix the power module body portion 100a, the power module body portion 100b, and the power module body portion 100c, and the wiring board 200, with the heat release effect of the power module 100 being increased. Also, the resin suppresses corrosion of the P-phase busbar 200a, the N-phase busbar 200c, and the U-phase busbar 200b that connect the power module body portion 100a and the wiring board 200. The resin may be replaced with a thermal conductive compound.

Next, a specific configuration of the power module body portion 100a according to the first embodiment of the present disclosure will be described.

As illustrated in FIGS. 1 to 5, the power module body portion 100a includes a metal plate 1, an insulating plate 2, a P-side substrate 3, an N-side substrate 4, two P-side semiconductor elements 5, two N-side semiconductor elements 6, four columnar electrodes 7, two P-side control terminals 8, two N-side control terminals 9, a P-side terminal 10, a U-phase terminal 11, and an N-side terminal 12. The metal plate 1, the P-side substrate 3, and the N-side substrate 4 are composed of metal, such as copper. The insulating plate 2 is composed of an insulating material, such as ceramic. In the power module body portion 100a, the metal plate 1, the insulating plate 2, and the P-side substrate 3 form a P-side insulating circuit board, and the metal plate 1, the insulating plate 2, and the N-side substrate 4 form an N-side insulating circuit board. The P-side semiconductor elements 5 correspond to an example of the "power-conversion semiconductor element" that is disclosed, and an example of the "positive-side semiconductor element" that is disclosed. The N-side semiconductor elements 6 correspond to an example of the "power-conversion semiconductor element" that is disclosed, and an example of the "negative-side semiconductor element" that is disclosed. The P-side terminal 10, the U-phase terminal 11, and the N-side terminal 12 are an example of the "positive-side terminal", an example of the "input/output terminal", and an example of the "negative-side terminal" that are disclosed, respectively.

Figure 6:
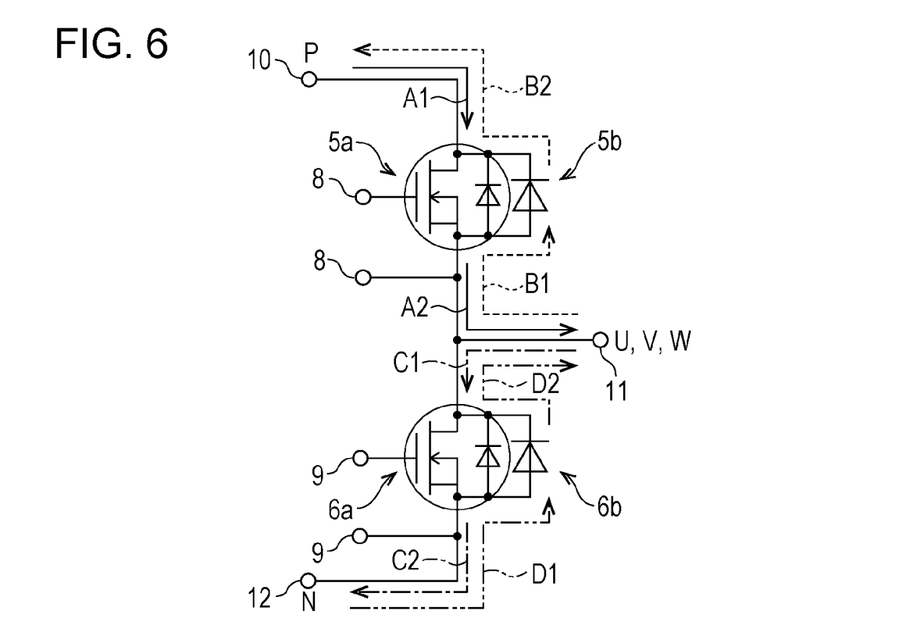
FIG. 6 is a circuit diagram of the power module according to the first embodiment of the present disclosure.

The two P-side semiconductor elements 5 are constituted by one P-side transistor element 5a and one P-side diode element 5b. The P-side transistor 5a is, for example, a metal-oxide-semiconductor field-effect transistor (MOSFET). The P-side diode element 5b is, for example, a Schottky barrier diode (SBD). The P-side diode element 5b has a function as a free wheel diode. As illustrated in FIG. 6, the P-side transistor element 5a and the P-side diode element 5b are electrically connected in parallel to each other. Specifically, the cathode electrode of the P-side diode element 5b is electrically connected to the drain electrode of the P-side transistor element 5a. The anode electrode of the P-side diode element 5b is electrically connected to the source electrode of the P-side transistor element 5a. The P-side transistor element 5a is an example of the "voltage-driven transistor element" that is disclosed. The P-side diode element 5b is an example of the "free wheel diode element" that is disclosed.

Figure 5:
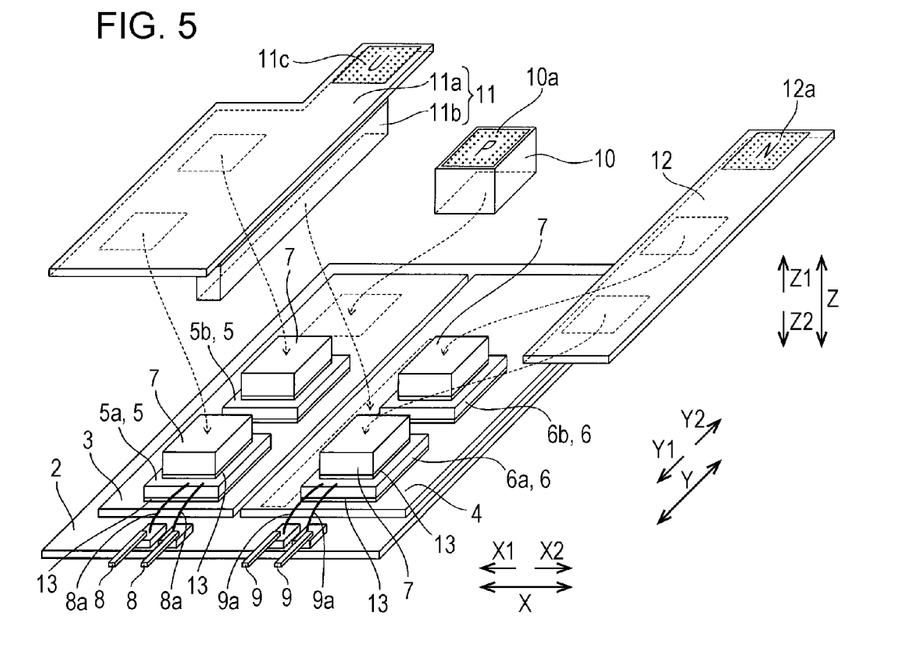
FIG. 5 is an exploded perspective view illustrating the inner configuration of the power module body portion according to the first embodiment of the present disclosure.

The drain electrode of the P-side transistor element 5a and the cathode electrode of the P-side diode element 5b are electrically connected to the P-side substrate 3. As illustrated in FIG. 5, the lower surfaces (the surfaces on the side indicated by arrow Z2) of the P-side transistor element 5a and the P-side diode element 5b are connected to the upper surface (the surface on the side indicated by arrow Z1) of the P-side substrate 3 via joint materials 13 composed of solder. The P-side transistor element 5a and the P-side diode element 5b are disposed side by side in the Y direction with a certain distance therebetween on the front surface of the P-side substrate 3. The P-side transistor element 5a is disposed on the side indicated by arrow Y1 with respect to the P-side diode element 5b.

Likewise, the two N-side semiconductor elements 6 are constituted by one N-side transistor element 6a and one N-side diode element 6b. The N-side diode element 6b has a function as a free wheel diode. As illustrated in FIG. 6, the N-side transistor element 6a and the N-side diode element 6b are electrically connected in parallel to each other. Specifically, the cathode electrode of the N-side diode element 6b is electrically connected to the drain electrode of the N-side transistor element 6a. The anode electrode of the N-side diode element 6b is electrically connected to the source electrode of the N-side transistor element 6a. The N-side transistor element 6a is an example of the "voltage-driven transistor element" that is disclosed. The N-side diode element 6b is an example of the "free wheel diode element" that is disclosed.

As illustrated in FIG. 5, the N-side transistor element 6a and the N-side diode element 6b are disposed side by side in the Y direction on the upper surface (the surface on the side indicated by arrow Z1) of the N-side substrate 4. The N-side transistor element 6a is disposed on the side indicated by arrow Y1 with respect to the N-side diode element 6b. The P-side transistor element 5a and the N-side transistor element 6a, and the P-side diode element 5b and the N-side diode element 6b are disposed side by side in the X direction. The P-side transistor element 5a and the P-side diode element 5b are disposed on the side indicated by arrow X1 with respect to the N-side transistor element 6a and the N-side diode element 6b.

The two P-side control terminals 8 are respectively connected to a gate electrode and a source electrode provided on the upper surface (the surface on the side indicated by arrow Z1) of the P-side transistor element 5a via wires 8a using wire bonding. Likewise, the two N-side control terminals 9 are respectively connected to a gate electrode and a source electrode provided on the upper surface of the N-side transistor element 6a via wires 9a using wire bonding. The two P-side control terminals 8 and the two N-side control terminals 9 protrude in the direction indicated by arrow Y1 from the side surface on the side indicated by arrow Y1 of a resin material 14 (described below) of the power module body portion 100a.

The P-side terminal 10 is configured to be connected to the upper surface (the surface on the side indicated by arrow Z1) of the P-side substrate 3 via a joint material 13. Further, the P-side terminal 10 is configured to be electrically connected to the drain electrode of the P-side transistor element 5a and the cathode electrode of the P-side diode element 5b via the P-side substrate 3. The P-side terminal 10 is formed in a substantially column shape extending in the Z direction.

The U-phase terminal 11 is constituted by a U-phase terminal portion 11a and a P side-N side connection electrode portion 11b. As illustrated in FIG. 5, the U-phase terminal portion 11a is formed in a substantially flat plate shape extending in the X and Y directions. The P side-N side connection electrode portion 11b is formed in a substantially column shape extending in the Y and Z directions.

The U-phase terminal portion 11a is configured to be connected to the upper surfaces of the two columnar electrodes 7 that are connected to the upper surfaces (the surfaces on the side indicated by arrow Z1) of the P-side transistor element 5a and the P-side diode element 5b via joint materials 13. Further, the U-phase terminal portion 11a is configured to be electrically connected to the source electrode of the P-side transistor element 5a and the anode electrode of the P-side diode element 5b via the two columnar electrodes 7. The columnar electrodes 7 are formed in a substantially column shape extending in the Z direction.

The P side-N side connection electrode portion 11b is configured to be connected to the upper surface (the surface on the side indicated by arrow Z1) of the N-side substrate 4 via a joint material 13. The P side-N side connection electrode portion 11b is provided to electrically connect the P-side semiconductor elements 5 (the P-side transistor element 5a and the P-side diode element 5b) that are connected to the U-phase terminal portion 11a, and the N-side semiconductor elements 6 (the N-side transistor element 6a and the N-side diode element 6b) that are connected to the N-side substrate 4. Specifically, the source electrode of the P-side transistor element 5a and the anode electrode of the P-side diode element 5b, and the drain electrode of the N-side transistor element 6a and the cathode electrode of the N-side diode element 6b, are electrically connected to each other by the P side-N side connection electrode portion 11b.

The N-side terminal 12 is formed in a substantially flat plate shape extending in the X and Y directions. Further, the N-side terminal 12 is configured to be connected to the upper surfaces of the two columnar electrodes 7 that are connected to the upper surfaces (the surfaces on the side indicated by arrow Z1) of the N-side transistor element 6a and the N-side diode element 6b via joint materials 13. Further, the N-side terminal 12 is configured to be electrically connected to the source electrode of the N-side transistor element 6a and the anode electrode of the N-side diode element 6b via the two columnar electrodes 7.

Here, in the first embodiment, the P-side terminal connection portion 10a, the U-phase terminal connection portion 11c, and the N-side terminal connection portion 12a (see dotted portions in FIGS. 1 to 5 and FIGS. 7 to 9) are provided on the upper surfaces (the surfaces on the side indicated by arrow Z1) of the P-side terminal 10, the U-phase terminal 11, and the N-side terminal 12, respectively. The P-side terminal connection portion 10a, the U-phase terminal connection portion 11c, and the N-side terminal connection portion 12a are provided to establish electrical connection with the wiring board 200. The P-side terminal connection portion 10a, the U-phase terminal connection portion 11c, and the N-side terminal connection portion 12a function as inlets and outlets for current that flows in and out between the power module body portion 100a and the wiring board 200. The P-side terminal connection portion 10a, the U-phase terminal connection portion 11c, and the N-side terminal connection portion 12a correspond to an example of the "first wiring board connection portion" and the "second wiring board connection portion" that are disclosed, and also correspond to an example of the "wiring board connection portion" that is disclosed. A P-side terminal connection portion, a V-phase terminal connection portion, and an N-side terminal connection portion are provided in the power module body portion 100b, and a P-side terminal connection portion, a W-phase terminal connection portion, and an N-side terminal connection portion are provided in the power module body portion 100c, so as to correspond to the above-described P-side terminal connection portion 10a, the U-phase terminal connection portion 11c, and the N-side terminal connection portion 12a.

In the first embodiment, as illustrated in FIGS. 6 to 9, a current that has flown into the power module body portion 100a from the wiring board 200 via the P-side terminal connection portion 10a of the P-side terminal 10 passes through the P-side transistor element 5a via the P-side substrate 3, and then flows out toward the wiring board 200 via the columnar electrode 7 on the P-side transistor element 5a and the U-phase terminal connection portion 11c of the U-phase terminal 11. A current that has flown into the P-side diode element 5b from the wiring board 200 via the U-phase terminal connection portion 11c passes through the P-side diode element 5b, and then flows out toward the wiring board 200 via the P-side terminal connection portion 10a. A current that has flown into the N-side transistor element 6a from the wiring board 200 via the U-phase terminal connection portion 11c of the U-phase terminal 11 and the N-side substrate 4 passes through the N-side transistor element 6a, and then flows out toward the wiring board 200 via the columnar electrode 7 on the N-side transistor element 6a and the N-side terminal connection portion 12a of the N-side terminal 12. A current that has flown into the N-side diode element 6b from the wiring board 200 via the N-side terminal connection portion 12a passes through the N-side diode element 6b, and then flows out toward the wiring board 200 via the U-phase terminal connection unit 11c.

Figure 7:
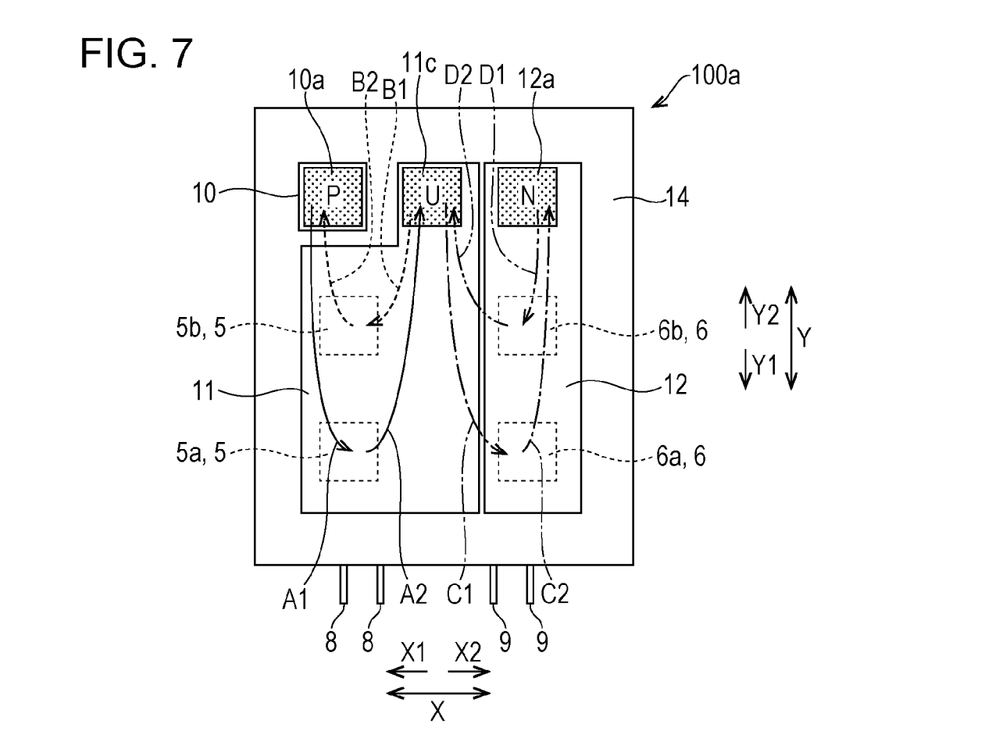
FIG. 7 is a plan view illustrating paths of currents flowing in the power module body portion according to the first embodiment of the present disclosure.
Figure 8:
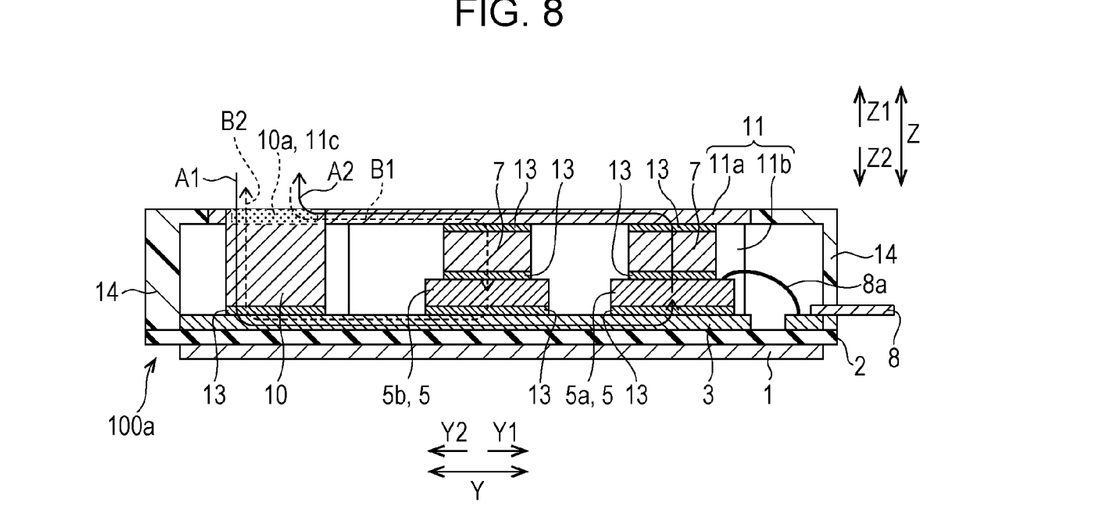
FIG. 8 is a cross-sectional view taken along a Y direction illustrating paths of currents flowing in an upper arm (P side) of the power module body portion according to the first embodiment of the present disclosure.

As illustrated in FIG. 7, the P-side terminal connection portion 10a and the U-phase terminal connection portion 11c are disposed side by side in the X direction at the positions which are spaced away in the same direction (the direction indicated by arrow Y2) from the P-side semiconductor elements 5 (the P-side transistor element 5a and the P-side diode element 5b) viewed from the upper surface side (the side indicated by arrow Z1) of the power module body portion 100a. Accordingly, as illustrated in FIGS. 7 and 8, the direction in which a current flows from the P-side terminal connection portion 10a toward the P-side transistor element 5a (see arrow A1) is substantially opposite to the direction in which a current flows from the P-side transistor element 5a toward the U-phase terminal connection portion 11c (see arrow A2). Also, the direction in which a current flows from the U-phase terminal connection portion 11c toward the P-side diode element 5b (see arrow B1) is substantially opposite to the direction in which a current flows from the P-side diode element 5b toward the P-side terminal connection portion 10a (see arrow B2). These currents flowing in substantially opposite directions cancel out changes in magnetic fluxes generated at individual current paths. That is, in the first embodiment, in the upper arm (P side) of the power module body portion 100a, the positions of the P-side terminal connection portion 10a and the U-phase terminal connection portion 11c with respect to the P-side semiconductor elements 5 are set so that the direction in which a current that is to pass through either of the P-side semiconductor elements 5 flows is substantially opposite to the direction in which a current that has passed through the P-side semiconductor element 5 flows. In the first embodiment, the distance between two current paths along which the current that is to pass through either of the P-side semiconductor elements 5 flows and the current that has passed through the P-side semiconductor element 5 flows, respectively, is set so that the currents flowing in substantially opposite directions along the two current paths enable cancelling out of changes in magnetic fluxes.

Furthermore, in the first embodiment, the current path along which a current flows from the P-side terminal connection portion 10a toward the P-side transistor element 5a (see arrow A1) and the current path along which a current flows from the P-side transistor element 5a toward the U-phase terminal connection portion 11c (see arrow A2) face each other. Also, the current path along which a current flows from the U-phase terminal connection portion 11c toward the P-side diode element 5b (see arrow B1) and the current path along which a current flows from the P-side diode element 5b toward the P-side terminal connection portion 10a (see arrow B2) face each other. That is, in the first embodiment, in the upper arm (P side) of the power module body portion 100a, the positions of the P-side terminal connection portion 10a and the U-phase terminal connection portion 11c with respect to the P-side semiconductor elements 5 are set so that the two current paths along which a current that is to pass through either of the P-side semiconductor elements 5 (the P-side transistor element 5a and the P-side diode element 5b) flows and a current that has passed through the P-side semiconductor element 5 flows, respectively, face each other.

Figure 9:
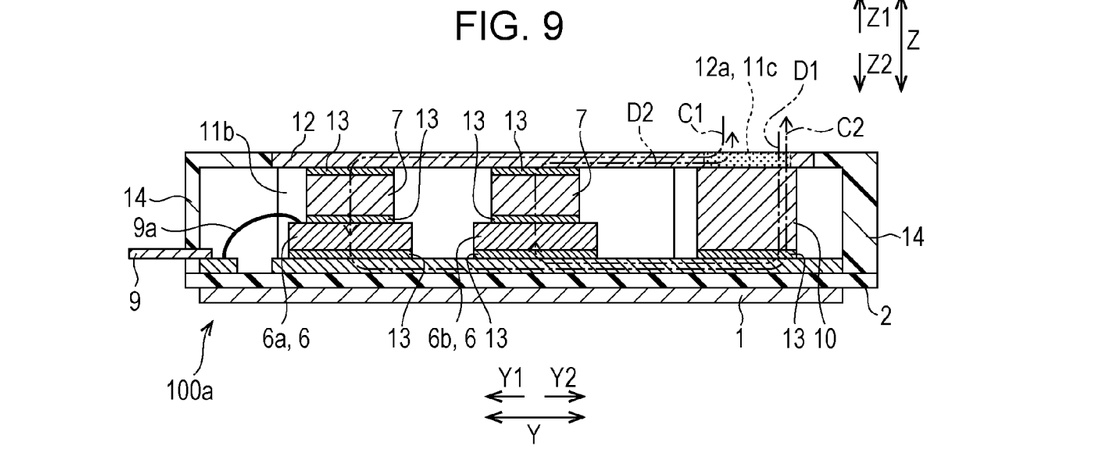
FIG. 9 is a cross-sectional view taken along the Y direction illustrating paths of currents flowing in a lower arm (N side) of the power module body portion according to the first embodiment of the present disclosure.

As illustrated in FIG. 7, the U-phase terminal connection portion 11c and the N-side terminal connection portion 12a are disposed side by side in the X direction with a certain distance therebetween at the positions which are spaced away in the same direction (the direction indicated by arrow Y2) from the N-side semiconductor elements 6 (the N-side transistor element 6a and the N-side diode element 6b) viewed from the upper surface side (the side indicated by arrow Z1) of the power module body portion 100a. Accordingly, as illustrated in FIGS. 7 and 9, the direction in which a current flows from the N-phase terminal connection portion 11c toward the N-side transistor element 6a (see arrow C1) is substantially opposite to the direction in which a current flows from the N-side transistor element 6a toward the N-side terminal connection portion 12a (see arrow C2). Also, the direction in which a current flows from the N-side terminal connection portion 12a toward the N-side diode element 6b (see arrow D1) is substantially opposite to the direction in which a current flows from the N-side diode element 6b toward the U-phase terminal connection portion 11c (see arrow D2). These currents flowing in substantially opposite directions cancel out changes in magnetic fluxes generated at individual current paths. That is, in the first embodiment, in the lower arm (N side) of the power module body portion 100a, the positions of the U-phase terminal connection portion 11c and the N-side terminal connection portion 12a with respect to the N-side semiconductor elements 6 are set so that the direction in which a current that is to pass through either of the N-side semiconductor elements 6 flows is substantially opposite to the direction in which a current that has passed through the N-side semiconductor element 6 flows. In the first embodiment, the distance between two current paths along which the current that is to pass through either of the N-side semiconductor elements 6 flows and the current that has passed through the N-side semiconductor element 6 flows, respectively, is set so that the currents flowing in substantially opposite directions along the two current paths enable cancelling out of changes in magnetic fluxes.

Furthermore, in the first embodiment, as illustrated in FIGS. 7 and 9, the current path along which a current flows from the U-phase terminal connection portion 11c toward the N-side transistor element 6a (see arrow C1) and the current path along which a current flows from the N-side transistor element 6a toward the N-side terminal connection portion 12a (see arrow C2) face each other. Also, the current path along which a current flows from the N-side terminal connection portion 12a toward the N-side diode element 6b (see arrow D1) and the current path along which a current flows from the N-side diode element 6b toward the U-phase terminal connection portion 11c (see arrow D2) face each other. That is, in the first embodiment, in the lower arm (N side) of the power module body portion 100a, the positions of the U-phase terminal connection portion 11c and the N-side terminal connection portion 12a with respect to the N-side semiconductor elements 6 (the N-side transistor element 6a and the N-side diode element 6b) are set so that the two current paths along which a current that is to pass through either of the N-side semiconductor elements 6 (the N-side transistor element 6a and the N-side diode element 6b) flows and a current that has passed through the N-side semiconductor element 6 flows, respectively, face each other.

As illustrated in FIGS. 1 to 4 and FIGS. 7 to 9, the power module body portion 100a is provided with the insulating resin material 14 composed of silicon gel or the like so as to cover the insulating plate 2, the P-side substrate 3, the N-side substrate 4, the two P-side semiconductor elements 5, the two N-side semiconductor elements 6, the columnar electrodes 7, the P-side terminal 10, the U-phase terminal 11, and the N-side terminal 12. The resin material 14 is provided to form an exterior of the power module body portion 100a. The P-side terminal 10, the U-phase terminal 11, and the N-side terminal 12 are exposed on the upper surface (the surface on the side indicated by arrow Z1) of the resin material 14. The surfaces of the P-side terminal 10, the U-phase terminal 11, and the N-side terminal 12 which are exposed on the upper surface of the resin material 14 have substantially the same height. The resin material 14 is an example of the "sealing material" that is disclosed.

In the first embodiment, as described above, the power module body portion 100a includes the P-side semiconductor elements 5 and the N-side semiconductor elements 6, and the P-side terminal connection portion 10a, the U-phase terminal connection portion 11c, and the N-side terminal connection portion 12a which establish electrical connection with the wiring board 200 on the upper surface (the surface on the side indicated by arrow Z1) of the power module body portion 100a, and into which a current flows from the wiring board 200 and from which a current flows to the wiring board 200. Accordingly, the wiring board 200 can be mounted on the upper surface of the power module body portion 100a, and thus the wiring board 200 can be easily mounted. Also, in the first embodiment, the positions of the P-side terminal connection portion 10a and the U-phase terminal connection portion 11c (the U-phase terminal connection portion 11c and the N-side terminal connection portion 12a) with respect to the P-side semiconductor elements 5 (the N-side semiconductor elements 6) are set so that, in a case where a current flows from the wiring board 200 into either of the P-side semiconductor elements 5 (the N-side semiconductor elements 6) via one of the P-side terminal connection portion 10a and the U-phase terminal connection portion 11c (the U-phase terminal connection portion 11c and the N-side terminal connection portion 12a) and then the current flows out toward the wiring board 200 via the other of the P-side terminal connection portion 10a and the U-phase terminal connection portion 11c (the U-phase terminal connection portion 11c and the N-side terminal connection portion 12a), the direction in which a current that is to pass through the P-side semiconductor element 5 (the N-side semiconductor element 6) flows is substantially opposite to the direction in which a current that has passed through the P-side semiconductor element 5 (the N-side semiconductor element 6) flows, and flowing of the currents in substantially opposite directions enables cancelling out of changes in magnetic fluxes. Accordingly, changes in magnetic fluxes that are generated at individual current paths by the current that is to pass through the P-side semiconductor element 5 (the N-side semiconductor element 6) and the current that has passed through the P-side semiconductor element 5 (the N-side semiconductor element 6) can be cancelled out within the power module 100. Furthermore, compared to a case where wiring in the power module 100 is designed using wires or the like, the total length of current paths inside the power module 100 can be reduced, and accordingly the wiring inductance of the entire device can be reduced.

In the first embodiment, as described above, the distance between two current paths along which a current that is to pass through the P-side semiconductor element 5 (the N-side semiconductor element 6) flows and a current that has passed through the P-side semiconductor element 5 (the N-side semiconductor element 6) flows, respectively, is set so that the currents flowing in substantially opposite directions along the two current paths enable cancelling out of changes in magnetic fluxes. Accordingly, the current that is to pass through the P-side semiconductor element 5 (the N-side semiconductor element 6) and the current that has passed through the P-side semiconductor element 5 (the N-side semiconductor element 6) can reliably cancel out changes in magnetic fluxes generated at the individual current paths, and thus the wiring inductance of the entire device can be reliably reduced.

In the first embodiment, as described above, the positions of the P-side terminal connection portion 10a and the U-phase terminal connection portion 11c (the U-phase terminal connection portion 11c and the N-side terminal connection portion 12a) with respect to the P-side semiconductor elements 5 (the N-side semiconductor elements 6) are set so that the two current paths along which a current that is to pass through either of the P-side semiconductor elements 5 (the N-side semiconductor elements 6) flows and a current that has passed through the P-side semiconductor element 5 (the N-side semiconductor element 6) flows, respectively, face each other. Accordingly, the two current paths along which a current that is to pass through the P-side semiconductor element 5 (the N-side semiconductor element 6) flows and a current that has passed through the P-side semiconductor element 5 (the N-side semiconductor element 6) flows, respectively, face each other. Thus, the current that is to pass through the P-side semiconductor element 5 (the N-side semiconductor element 6) and the current that has passed through the P-side semiconductor element 5 (the N-side semiconductor element 6) can cancel out changes in magnetic fluxes generated at the individual current paths more reliably. As a result, the wiring inductance of the entire device can be reliably reduced.

In the first embodiment, as described above, the P-side terminal connection portion 10a and the U-phase terminal connection portion 11c are disposed side by side in the X direction at the positions which are spaced away in the same direction (the direction indicated by arrow Y2) from the P-side semiconductor elements 5 viewed from the upper surface side (the side indicated by arrow Z1) of the power module body portion 100a. Further, the configuration is designed so that the direction in which a current flows from one of the P-side terminal connection portion 10a and the U-phase terminal connection portion 11c toward either of the P-side semiconductor elements 5 (see arrow A1 or B1) is substantially opposite to the direction in which a current flows from either of the P-side semiconductor elements 5 toward the other of the P-side terminal connection portion 10a and the U-phase terminal connection portion 11c (see arrow A2 or B2), and flowing of the currents in substantially opposite directions enables cancelling out of changes in magnetic fluxes. Accordingly, changes in magnetic fluxes generated at the individual current paths by the current that is to pass through the P-side semiconductor element 5 and the current that has passed through the P-side semiconductor element 5 can be easily cancelled out within the power module body portion 100a on the side where the P-side semiconductor elements 5 are disposed (the side indicated by arrow X1).

In the first embodiment, as described above, the U-phase terminal connection portion 11c and the N-side terminal connection portion 12a are disposed side by side in the X direction at the positions which are spaced away in the same direction (the direction indicated by arrow Y2) from the N-side semiconductor elements 6 viewed from the upper surface side (the side indicated by arrow Z1) of the power module body portion 100a. Further, the configuration is designed so that the direction in which a current flows from one of the U-phase terminal connection portion 11c and the N-side terminal connection portion 12a toward either of the N-side semiconductor elements 6 (see arrow C1 or D1) is substantially opposite to the direction in which a current flows from either of the N-side semiconductor elements 6 toward the other of the U-phase terminal connection portion 11c and the N-side terminal connection portion 12a (see arrow C2 or D2), and flowing of the currents in substantially opposite directions enables cancelling out of changes in magnetic fluxes. Accordingly, changes in magnetic fluxes generated at the individual current paths by the current that is to pass through the N-side semiconductor element 6 and the current that has passed through the N-side semiconductor element 6 can be easily cancelled out within the power module body portion 100a on the side where the N-side semiconductor elements 6 are disposed (the side indicated by arrow X2).

In the first embodiment, as described above, the resin material 14 which is composed of resin and which covers the power module body portion 100a is provided. The resin material 14 is configured so that the P-side terminal connection portion 10a, the U-phase terminal connection portion 11c, and the N-side terminal connection portion 12a are exposed on the upper surface (the surface on the side indicated by arrow Z1) of the resin material 14. Further, the exposed surfaces of the P-side terminal connection portion 10a, the U-phase terminal connection portion 11c, and the N-side terminal connection portion 12a exposed on the upper surface of the resin material 14 have substantially the same height. Accordingly, the exposed surfaces of the P-side terminal connection portion 10a, the U-phase terminal connection portion 11c, and the N-side terminal connection portion 12a exposed on the upper surface of the resin material 14 are flush with one another, and thus the upper surface of the power module body portion 100a is flat. As a result, the wiring board 200 can be mounted on the upper surface of the power module body portion 100a more easily.

Second Embodiment

Next, a power module 101 according to a second embodiment of the present disclosure will be described with reference to FIGS. 10 to 14. In the second embodiment, description will be given of an example in which, unlike in the first embodiment in which changes in magnetic fluxes generated by currents flowing in the power module 100 are cancelled out within the power module body portion 100a, changes in magnetic fluxes generated by currents flowing in the power module 101 are cancelled out within the entire power module 101, which includes a power module body portion 101a and a wiring board 201.

Figure 10:
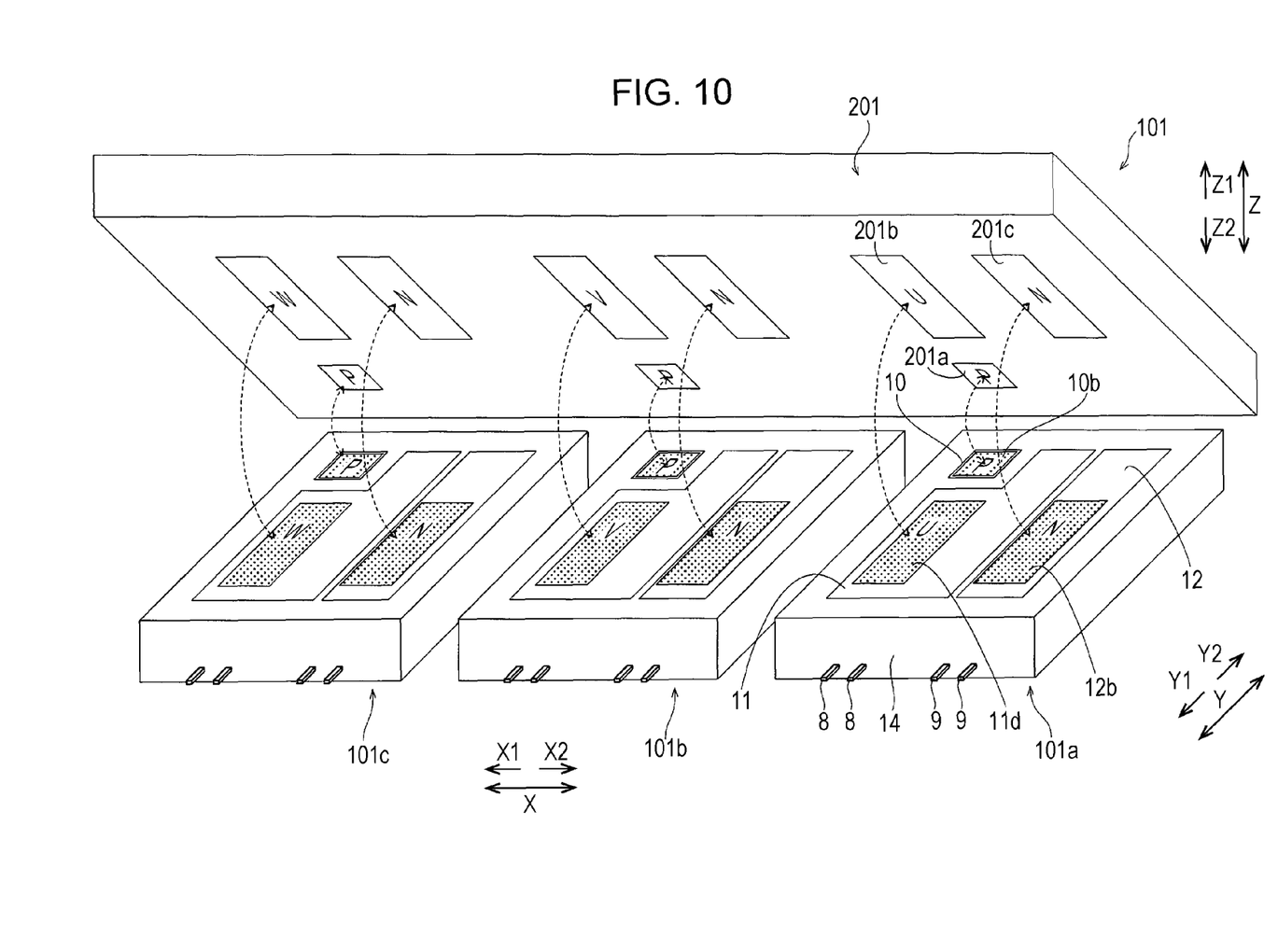
FIG. 10 is an exploded perspective view illustrating the configuration of a power module according to a second embodiment of the present disclosure.
Figure 11:
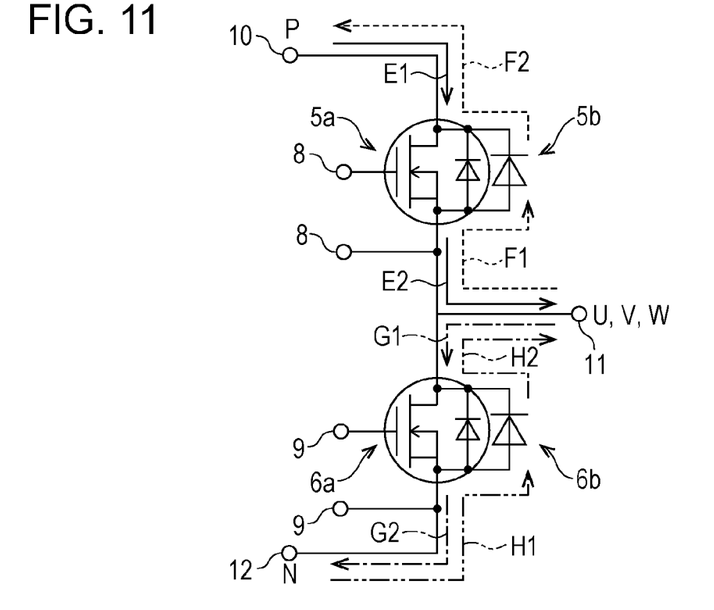
FIG. 11 is a circuit diagram of the power module according to the second embodiment of the present disclosure.

As illustrated in FIG. 10, the power module 101 according to the second embodiment of the present disclosure includes three power module body portions 101a, 101b, and 101c, and the wiring board 201. The power module body portions 101a, 101b, and 101c have substantially the same configuration, and thus description will be given below mainly of the power module body portion 101a. The power module 101 is an example of the "power converter" that is disclosed. Each of the power module body portions 101a, 101b, and 101c is an example of the "power converter body portion" that is disclosed.

The power module body portion 101a is configured to be electrically connected to the wiring board 201 on the upper surface (the surface on the side indicated by arrow Z1) of the power module body portion 101a. Specifically, the power module body portion 101a is configured so that a P-side terminal connection portion 10b, a U-phase terminal connection portion 11d, and an N-side terminal connection portion 12b (see dotted portions in FIGS. 10 and 12 to 14) of the power module body portion 101a are connected to portions of a P-phase busbar 201a, a U-phase busbar 201b, and an N-phase busbar 201c of the wiring board 201 which are exposed on the lower surface (the surface on the side indicated by arrow Z2) of the wiring board 201. The U-phase busbar 201b and the N-phase busbar 201c are an example of the "input/output line" and an example of the "negative-side line" that are disclosed, respectively. The P-side terminal connection portion 10b, the U-phase terminal connection portion 11d, and the N-side terminal connection portion 12b are an example of the "positive-side terminal connection portion", an example of the "input/output terminal connection portion", and an example of the "negative-side terminal connection portion" that are disclosed, respectively. The power module body portion 101b includes a P-side terminal connection portion, a V-phase terminal connection portion, and an N-side terminal connection portion, and the power module body portion 101c includes a P-side terminal connection portion, a W-phase terminal connection portion, and an N-side terminal connection portion, so as to correspond to the above-described P-side terminal connection portion 10b, U-phase terminal connection portion 11d, and N-side terminal connection portion 12b. In the wiring board 201, a V-phase busbar and a W-phase busbar are provided so as to correspond to the V-phase terminal connection portion and the W-phase terminal connection portion of the power module body portions 101b and 101c.

The P-side terminal connection portion 10b, the U-phase terminal connection portion 11d, and the N-side terminal connection portion 12b of the power module body portion 101a function as inlets and outlets for current that flows in and out between the power module body portion 101a and the wiring board 201. The P-side terminal connection portion 10b, the U-phase terminal connection portion 11d, and the N-side terminal connection portion 12b correspond to an example of the "first wiring board connection portion" and the "second wiring board connection portion" that are disclosed, and also correspond to an example of the "wiring board connection portion" that is disclosed.

In the second embodiment, as illustrated in FIGS. 11 to 14, a current that has flown from the P-side terminal connection portion 10b of the P-side terminal 10 of the power module body portion 101a into the P-side transistor element 5a via the P-phase busbar 201a of the wiring board 201 passes through the P-side transistor element 5a and then flows out from the U-phase terminal connection portion 11d of the U-phase terminal 11 via the U-phase busbar 201b of the wiring board 201. A current that has flown from the U-phase terminal connection portion 11d of the U-phase terminal 11 of the power module body portion 101a into the P-side diode element 5b via the U-phase busbar 201b of the wiring board 201 passes through the P-side diode element 5b and then flows out from the P-side terminal connection portion 10b of the P-side terminal 10 via the P-phase busbar 201a of the wiring board 201. A current that has flown from the U-phase terminal connection portion 11d of the U-phase terminal 11 of the power module body portion 101a into the N-side transistor element 6a via the U-phase busbar 201b of the wiring board 201 passes through the N-side transistor element 6a and then flows out from the N-side terminal connection portion 12b of the N-side terminal 12 via the N-phase busbar 201c of the wiring board 201. A current that has flown from the N-side terminal connection portion 12b of the N-side terminal 12 of the power module body portion 101a into the N-side diode element 6b via the N-phase busbar 201c of the wiring board 201 passes through the N-side diode element 6b and then flows out from the U-phase terminal connection portion 11d of the U-phase terminal 11 via the U-phase busbar 201b of the wiring board 201.

Figure 12:
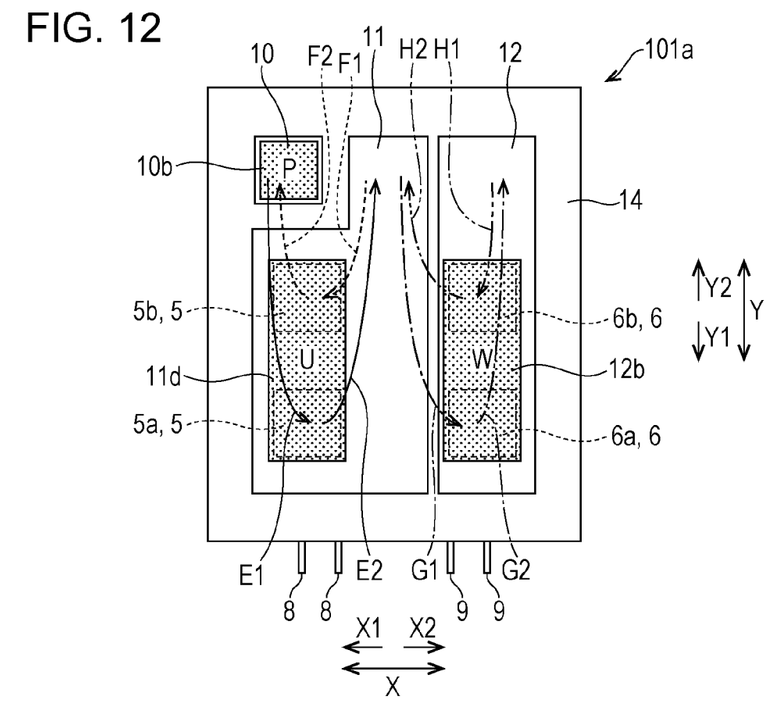
FIG. 12 is a plan view illustrating paths of currents flowing in the power module according to the second embodiment of the present disclosure.
Figure 13:
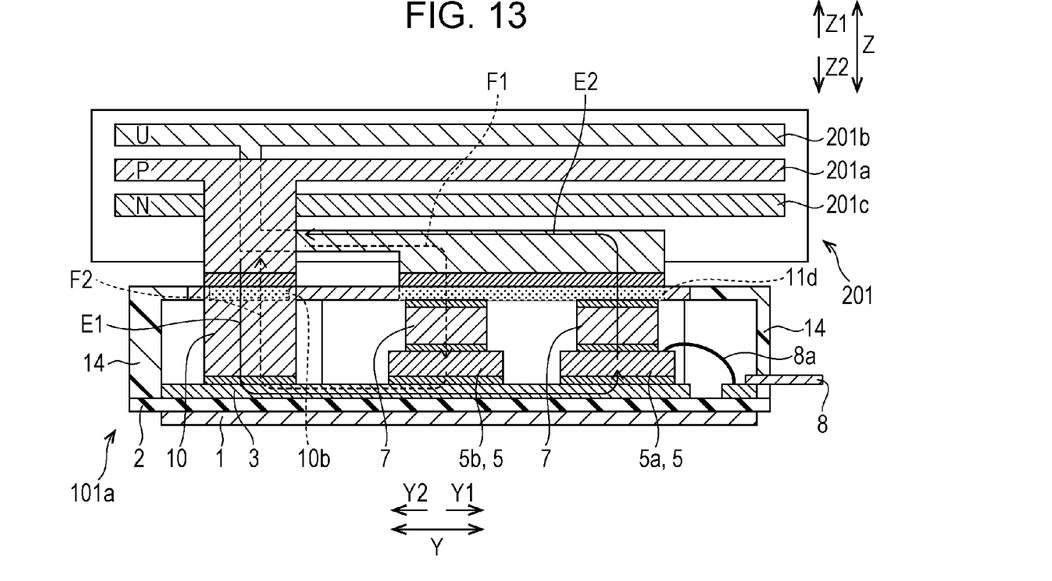
FIG. 13 is a cross-sectional view taken along the Y direction illustrating paths of currents flowing in an upper arm (P side) of the power module according to the second embodiment of the present disclosure.

In the second embodiment, as illustrated in FIGS. 12 and 13, the U-phase terminal connection portion 11d is disposed above (on the side indicated by arrow Z1) the P-side semiconductor elements 5 (the P-side transistor element 5a and the P-side diode element 5b) provided in the power module body portion 101a. The U-phase terminal connection portion 11d is disposed on the upper surface (the surface on the side indicated by arrow Z1) of the power module body portion 101a, at a certain distance from the P-side terminal connection portion 10b in the Y direction. The U-phase terminal connection portion 11d is disposed on the side indicated by arrow Y1 with respect to the P-side terminal connection portion 10b. On the other hand, as illustrated in FIG. 13, the U-phase busbar 201b of the wiring board 201 extends in the wiring board 201 substantially in parallel with the direction in which the P-side terminal connection portion 10b and the U-phase terminal connection portion 11d are arranged (Y direction). Accordingly, in the power module body portion 101a, the directions in which currents flow between the P-side terminal connection portion 10b and the P-side semiconductor elements 5 (see arrows E1 and F2) are substantially opposite to the directions in which currents flow via the U-phase busbar 201b of the wiring board 201 (see arrows E2 and F1). These currents flowing in substantially opposite directions cancel out changes in magnetic fluxes generated at the individual current paths within the entire power module 101, including the power module body portion 101a and the wiring board 201.

Figure 14:
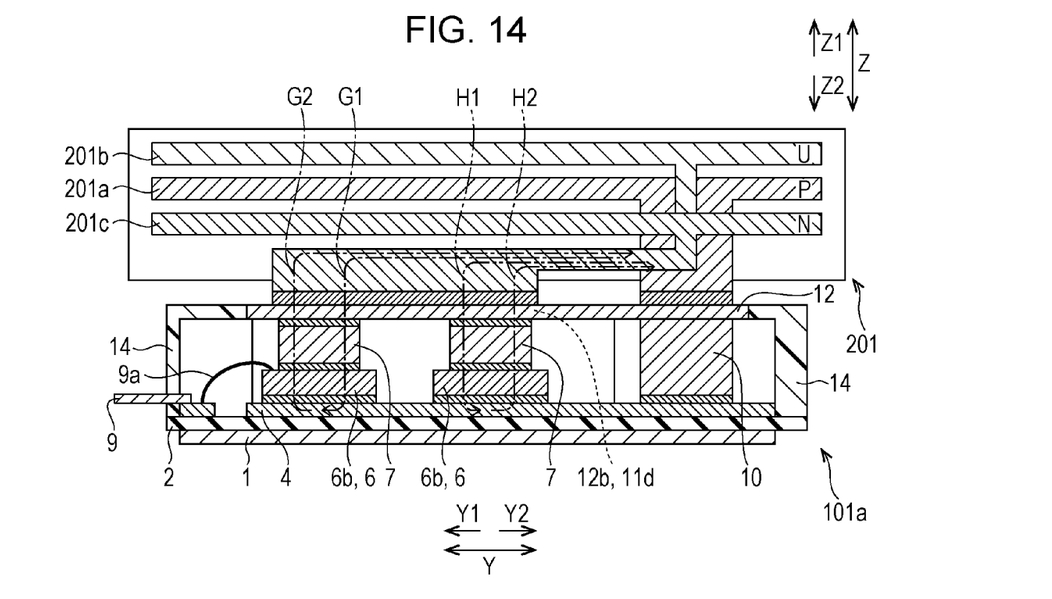
FIG. 14 is a cross-sectional view taken along the Y direction illustrating paths of currents flowing in a lower arm (N side) of the power module according to the second embodiment of the present disclosure.

In the second embodiment, as illustrated in FIGS. 12 and 14, the N-side terminal connection portion 12b is disposed above (on the side indicated by arrow Z1) the N-side semiconductor elements 6 provided in the power module body portion 101a. The N-side terminal connection portion 12b is disposed on the upper surface (the surface on the side indicated by arrow Z1) of the power module body portion 101a, at a certain distance from the U-phase terminal connection portion 11d in the X direction. The N-side terminal connection portion 12b is disposed on the side indicated by arrow X2 with respect to the U-phase terminal connection portion 11d. On the other hand, as illustrated in FIG. 14, the N-phase busbar 201c of the wiring board 201 and the U-phase busbar 201b of the wiring board 201 extend substantially in parallel with each other (in the Y direction) in the wiring board 201. Accordingly, the directions in which currents flow via the U-phase busbar 201b in the wiring board 201 (see arrows G1 and H2) are substantially opposite to the directions in which currents flow via the N-phase busbar 201c in the wiring board 201 (see arrows G2 and H1). These currents flowing in substantially opposite directions cancel out changes in magnetic fluxes generated at the individual current paths within the wiring board 201.

Other than what described above, the configuration of the second embodiment is the same as that of the first embodiment.

In the second embodiment, as described above, the U-phase busbar 201b electrically connected to the U-phase terminal connection portion 11d is provided in the wiring board 201. The U-phase terminal connection portion 11d is disposed above (on the side indicated by arrow Z1) the P-side semiconductor elements 5 disposed in the power module body portion 101a, and is aligned with the P-side terminal connection portion 10b on the upper surface (the surface on the side indicated by arrow Z1) of the power module body portion 101a. The U-phase busbar 201b extends substantially in parallel with the direction in which the P-side terminal connection portion 10b and the U-phase terminal connection portion 11d are arranged (Y direction). Also, the configuration is designed so that the directions in which currents flow between the P-side terminal connection portion 10b and the P-side semiconductor elements 5 in the power module body portion 101a (see arrows E1 and F2) are substantially opposite to the directions in which currents flow via the U-phase busbar 201b in the wiring board 201 (see arrows E2 and F1), and flowing of the currents in substantially opposite directions enables cancelling out of changes in magnetic fluxes. Accordingly, a change in the magnetic flux generated by currents flowing between the P-side terminal connection portion 10b and the P-side semiconductor elements 5 in the power module body portion 101a and a change in the magnetic flux generated by currents flowing via the U-phase busbar 201b in the wiring board 201 can be cancelled out. As a result, the wiring inductance of the entire power module 101 can be reduced using not only the power module body portion 101a but also the wiring board 201.

In the second embodiment, as described above, the U-phase busbar 201b electrically connected to the U-phase terminal connection portion 11d and the N-phase busbar 201c electrically connected to the N-side terminal connection portion 12b are provided in the wiring board 201. The U-phase busbar 201b and the N-phase busbar 201c extend substantially in parallel with each other in the wiring board 201. Also, the configuration is designed so that the directions in which currents flow via the U-phase busbar 201b in the wiring board 201 (see arrows G1 and H2) are substantially opposite to the directions in which currents flow via the N-phase busbar 201c in the wiring board 201 (see arrows G2 and H1), and flowing of the currents in substantially opposite directions enables cancelling out of changes in magnetic fluxes. Accordingly, a change in the magnetic flux generated by the currents flowing via the U-phase busbar 201b in the wiring board 201 and a change in the magnetic flux generated by the currents flowing via the N-phase busbar 201c in the wiring board 201 can be cancelled out. As a result, the wiring inductance of the entire power module 101 can be reduced using the wiring board 201 in the power module 101.

The other features of the second embodiment are the same as those of the first embodiment.

It is to be considered that the embodiments disclosed herein are examples from every viewpoint and are not restrictive. The scope of the present disclosure is defined by the scope of the claims, not by the description of the embodiments given above. Furthermore, all the modifications that are equivalent to the scope of the claims in the meaning and scope are included in the scope of the present disclosure.

For example, in the above-described first and second embodiments, a MOSFET and an SBD are used as the power-conversion semiconductor elements according to the present disclosure, but the present disclosure is not limited thereto. In the present disclosure, semiconductor elements other than a MOSFET and an SBD may be used as long as the semiconductor elements serve as power-conversion semiconductor elements.

In the above-described first and second embodiments, a MOSFET is used as the voltage-driven transistor according to the present disclosure, but the present disclosure is not limited thereto. In the present disclosure, other types of transistors, such as an IGBT, may be used as long as the transistors serve as voltage-driven transistors.

In the above-described first and second embodiments, an SBD is used as a free wheel diode, but the present disclosure is not limited thereto. In the present disclosure, other types of diodes, such as a fast recovery diode (FRD), may be used as long as the diodes serve as free wheel diodes.

In the above-described first and second embodiments, a set of a MOSFET and an SBD is disposed on each of the P side and N side of each power module body portion, but the present disclosure is not limited thereto. In the present disclosure, a plurality of sets of a MOSFET and an SBD may be disposed on each of the P side and N side of each power module body portion.

In the above-described first and second embodiments, the power module body portion and the wiring board are connected to each other using bump electrodes, but the present disclosure is not limited thereto. In the present disclosure, the power module body portion and the wiring board may be connected to each other using solder, Ag nanopaste, or the like.

It should be understood by those skilled in the art that various modifications, combinations, sub-combinations and alterations may occur depending on design requirements and other factors insofar as they are within the scope of the appended claims or the equivalents thereof.

What is claimed is:

1. A power converter comprising:
   a power converter body portion; and
   a wiring board that is electrically connected to the power converter body portion, wherein
   the power converter body portion includes a power-conversion semiconductor element and a wiring board connection portion, the wiring board connection portion including a first wiring board connection portion and a second wiring board connection portion which establish electrical connection with the wiring board on an upper surface of the power converter body portion and into which a current flows from the wiring board and from which a current flows to the wiring board, and
   positions of the first wiring board connection portion and the second wiring board connection portion with respect to the power-conversion semiconductor element are set so that, in a case where a current flows from the wiring board into the power-conversion semiconductor element via one of the first wiring board connection portion and the second wiring board connection portion and then the current flows out toward the wiring board via the other of the first wiring board connection portion and the second wiring board connection portion, a direction in which a current that is to pass through the power-conversion semiconductor element flows is substantially opposite to a direction in which a current that has passed through the power-conversion semiconductor element flows, and flowing of the currents in substantially opposite directions enables cancelling out of changes in magnetic fluxes.

2. The power converter according to claim 1, wherein a distance between two current paths along which the current that is to pass through the power-conversion semiconductor element flows and the current that has passed through the power-conversion semiconductor element flows, respectively, is set so that the currents flowing in substantially opposite directions along the two current paths enable cancelling out of changes in magnetic fluxes.

3. The power converter according to claim 1, wherein the positions of the first wiring board connection portion and the second wiring board connection portion with respect to the power-conversion semiconductor element are set so that two current paths along which the current that is to pass through the power-conversion semiconductor element flows and the current that has passed through the power-conversion semiconductor element flows, respectively, face each other.

4. The power converter according to claim 1, wherein
   the power-conversion semiconductor element includes a positive-side semiconductor element,
   the power converter body portion further includes a positive-side terminal and an input/output terminal for establishing electrical connection with the wiring board,
   the first wiring board connection portion and the second wiring board connection portion include a positive-side terminal connection portion and an input/output terminal connection portion, respectively, and
   positions of the positive-side terminal connection portion and the input/output terminal connection portion with respect to the positive-side semiconductor element are set so that, in a case where a current flows from the wiring board into the positive-side semiconductor element via one of the positive-side terminal connection portion and the input/output terminal connection portion and then the current flows out toward the wiring board via the other of the positive-side terminal connection portion and the input/output terminal connection portion, a direction in which a current that is to pass through the positive-side semiconductor element flows is substantially opposite to a direction in which a current that has passed through the positive-side semiconductor element flows, and flowing of the currents in substantially opposite directions enables cancelling out of changes in magnetic fluxes.

5. The power converter according to claim 4, wherein
   the positive-side terminal connection portion and the input/output terminal connection portion are disposed side by side at positions which are spaced away in the same direction from the positive-side semiconductor element viewed from an upper surface side of the power converter body portion, and
   the power converter is configured so that a direction in which a current flows from one of the positive-side terminal connection portion and the input/output terminal connection portion toward the positive-side semiconductor element is substantially opposite to a direction in which a current flows from the positive-side semiconductor element toward the other of the positive-side terminal connection portion and the input/output terminal connection portion, and flowing of the currents in substantially opposite directions enables cancelling out of changes in magnetic fluxes.

6. The power converter according to claim 4, wherein
   the wiring board includes therein an input/output line that is electrically connected to the input/output terminal connection portion,
   the input/output terminal connection portion is disposed above the positive-side semiconductor element that is disposed in the power converter body portion, and is aligned with the positive-side terminal connection portion on the upper surface of the power converter body portion,
   the input/output line extends substantially in parallel with a direction in which the positive-side terminal connection portion and the input/output terminal connection portion are arranged, and
   the power converter is configured so that a direction in which a current flows between the positive-side terminal connection portion and the positive-side semiconductor element in the power converter body portion is substantially opposite to a direction in which a current flows via the input/output line in the wiring board, and flowing of the currents in substantially opposite directions enables cancelling out of changes in magnetic fluxes.

7. The power converter according to claim 1, wherein
   the power-conversion semiconductor element includes a negative-side semiconductor element,
   the power converter body portion further includes a negative-side terminal and an input/output terminal for establishing electrical connection with the wiring board,
   the first wiring board connection portion and the second wiring board connection portion include a negative-side terminal connection portion and an input/output terminal connection portion, respectively, and
   positions of the negative-side terminal connection portion and the input/output terminal connection portion with respect to the negative-side semiconductor element are set so that, in a case where a current flows from the wiring board into the negative-side semiconductor element via one of the negative-side terminal connection portion and the input/output terminal connection portion and then the current flows out toward the wiring board via the other of the negative-side terminal connection portion and the input/output terminal connection portion, a direction in which a current that is to pass through the negative-side semiconductor element flows is substantially opposite to a direction in which a current that has passed through the negative-side semiconductor element flows, and flowing of the currents in substantially opposite directions enables cancelling out of changes in magnetic fluxes.

8. The power converter according to claim 7, wherein the negative-side terminal connection portion and the input/output terminal connection portion are disposed side by side at positions which are spaced away in the same direction from the negative-side semiconductor element viewed from an upper surface side of the power converter body portion, and the power converter is configured so that a direction in which a current flows from one of the negative-side terminal connection portion and the input/output terminal connection portion toward the negative-side semiconductor element is substantially opposite to a direction in which a current flows from the negative-side semiconductor element toward the other of the negative-side terminal connection portion and the input/output terminal connection portion, and flowing of the currents in substantially opposite directions enables cancelling out of changes in magnetic fluxes.

9. The power converter according to claim 7, wherein the wiring board includes therein a negative-side line that is electrically connected to the negative-side terminal connection portion and an input/output line that is electrically connected to the input/output terminal connection portion, the negative-side line and the input/output line extend substantially in parallel with each other in the wiring board, and the power converter is configured so that a direction in which a current flows via the input/output line in the wiring board is substantially opposite to a direction in which a current flows via the negative-side line in the wiring board, and flowing of the currents in substantially opposite directions enables cancelling out of changes in magnetic fluxes.

10. The power converter according to claim 1, wherein the power converter body portion further includes a positive-side terminal, a negative-side terminal, and an input/output terminal for establishing electrical connection with the wiring board, the wiring board connection portion includes a positive-side terminal connection portion, a negative-side terminal connection portion, and an input/output terminal connection portion, the power converter further includes a sealing material that is composed of resin and that covers the power converter body portion, the sealing material is configured to expose, on an upper surface of the sealing material, the positive-side terminal connection portion, the negative-side terminal connection portion, and the input/output terminal connection portion, and exposed surfaces of the positive-side terminal connection portion, the negative-side terminal connection portion, and the input/output terminal connection portion exposed on the upper surface of the sealing material have substantially the same height.

11. The power converter according to claim 1, wherein the power-conversion semiconductor element includes a voltage-driven transistor element, and positions of the first wiring board connection portion and the second wiring board connection portion with respect to the voltage-driven transistor element are set so that, in a case where a current flows from the wiring board into the voltage-driven transistor element via the first wiring board connection portion and then the current flows out toward the wiring board via the second wiring board connection portion, a direction in which a current that is to pass through the voltage-driven transistor element flows is substantially opposite to a direction in which a current that has passed through the voltage-driven transistor element flows, and flowing of the currents in substantially opposite directions enables cancelling out of changes in magnetic fluxes.

12. The power converter according to claim 11, wherein the power-conversion semiconductor element further includes a free wheel diode element that is connected in parallel with the voltage-driven transistor element, and positions of the first wiring board connection portion and the second wiring board connection portion with respect to the free wheel diode element are set so that, in a case where a current flows from the wiring board into the free wheel diode element via the second wiring board connection portion and then the current flows out toward the wiring board via the first wiring board connection portion, a direction in which a current that is to pass through the free wheel diode element flows is substantially opposite to a direction in which a current that has passed through the free wheel diode element flows, and flowing of the currents in substantially opposite directions enables cancelling out of changes in magnetic fluxes.

* * * * *